(12) United States Patent
Kim

(10) Patent No.: US 10,492,337 B2
(45) Date of Patent: Nov. 26, 2019

(54) COOLING RACK FOR SERVER

(71) Applicant: Gun Min Kim, Gwangju (KR)

(72) Inventor: Gun Min Kim, Gwangju (KR)

(*) Notice: Subject to any disclaimer, the term of this patent is extended or adjusted under 35 U.S.C. 154(b) by 0 days.

(21) Appl. No.: 16/137,751

(22) Filed: Sep. 21, 2018

(65) Prior Publication Data

US 2019/0104648 A1 Apr. 4, 2019

(51) Int. Cl.
*H05K 7/20* (2006.01)
*H05K 7/14* (2006.01)

(52) U.S. Cl.
CPC ....... *H05K 7/20736* (2013.01); *H05K 7/1489* (2013.01); *H05K 7/2039* (2013.01)

(58) Field of Classification Search
CPC .......... H05K 7/20554; H05K 7/20572; H05K 7/20718; H05K 7/20736; G06F 1/20
USPC ....................... 361/695–697, 679.47–679.49; 165/80.1–80.3; 454/184
See application file for complete search history.

(56) References Cited

U.S. PATENT DOCUMENTS

| | | | | |
|---|---|---|---|---|
| 6,123,266 A | * | 9/2000 | Bainbridge | H01M 2/1077 165/80.3 |
| 6,936,372 B1 | * | 8/2005 | Jagota | H01M 2/1077 429/50 |
| 7,525,799 B2 | * | 4/2009 | Lai | H05K 7/20572 361/695 |
| 2012/0142265 A1 | * | 6/2012 | Wei | H05K 7/20745 454/184 |

FOREIGN PATENT DOCUMENTS

| | | |
|---|---|---|
| KR | 10-0997045 | 11/2010 |
| KR | 10-1468873 | 12/2014 |
| KR | 10-1533007 | 7/2015 |

OTHER PUBLICATIONS

English Specification of 10-0997045.
English Specification of 10-1533007.
English Specification of 10-1468873.

* cited by examiner

*Primary Examiner* — Zachary Pape
(74) *Attorney, Agent, or Firm* — Antonio Ha & U.S. Patent, LLC

(57) ABSTRACT

A cooling rack comprises a server case with a receiving space, an inlet, and an outlet, a plurality of servers being received in the server case, a first blower unit provided adjacent to the inlet in the receiving space, a second blower unit provided adjacent to the outlet in the receiving space, and cooling units provided in the receiving space.

4 Claims, 4 Drawing Sheets

COOLING RACK FOR SERVER

CROSS-REFERENCE TO RELATED APPLICATIONS

This patent application claims priority under 35 U.S.C. § 119 to Korean Patent Application No. 10-2017-0130288, filed on Oct. 11, 2017, in the Korean Intellectual Property Office, the disclosure of which is incorporated by reference herein in its entirety.

TECHNICAL FIELD

The disclosure relates to a cooling rack for servers, and more specifically, to a cooling rack configured to prevent overheat of a server mounted therein.

DISCUSSION OF RELATED ART

Bitcoin or other types of cryptocurrencies are recently drawing attention.

Cryptocurrency is a digitally implemented currency and various kinds of such digital assets are spreading nowadays.

After bitcoin first appeared back in 2009, diversity of cryptocurrencies have been being introduced such as Litecoin and Namecoin in 2011, Peercoin in 2012, Ripple, Dogecoin, Mastercoin, and Primecoin in 2013, and Auroracoin in 2014. Despite their limitations in use, cryptocurrencies are flourishing by many advantages in transaction they provide.

For example, in some countries, such as the U.S., Canada, China, and Japan, more and more stores take payment by bitcoin, and other countries impose tax on transactions over bitcoin.

There have also been suggested technologies using cryptocurrency. As an example, Korean Patent Application Publication No. 2002-0012045 published on Feb. 15, 2002, titled "digital credit currency distribution system," discloses a system in which members of a website measure their product activities and are rewarded digital credit coins.

Meanwhile, bitcoins or other cryptocoins may be obtained by mining or sale.

Bitcoins, already created and issued, may be subject to sale or transactions, or new coins may be mined from the system.

The mining of bitcoins may be conducted by anyone who has computing equipment able to operate a decryption algorithm. However, decryption is not easy and is becoming tougher, thus requiring higher-end computing devices.

Recently, there are being developed and used dedicated servers performing only preset processing such as mining bitcoins.

Such dedicated servers conduct continuous computation for algorithm decoding to mine bitcoins and may thus be easily overheated. Unless cooled down, the system may stop working or be broken.

Therefore, a need exists for a rack able to cool down servers that only perform preset processing.

There have been introduced some types of racks capable of cooling down the servers therein.

However, such conventional server cooling racks which typically include an evaporator, a compressor, a condenser, and an expansion valve, are complicated in structure, consume much energy to condense the coolant, and are bulky due to the inclusion of an indoor unit and an outdoor unit.

SUMMARY

According to an embodiment of the disclosure, there is provided a cooling rack for server, with a simplified structure without the need for mechanical features, such as a condenser or compressor to cool down the server.

According to an embodiment of the disclosure, there is provided a cooling rack for servers, which may cool down a plurality of servers received therein with an enhanced cooling capability over the whole receiving space.

According to an embodiment of the disclosure, a cooling rack comprises a server case with a receiving space, an inlet, and an outlet, a plurality of servers being received in the server case, a first blower unit provided adjacent to the inlet in the receiving space, a second blower unit provided adjacent to the outlet in the receiving space, and cooling units provided in the receiving space.

For example, the server case includes first shelves attached on a first inner side wall of the server case and second shelves attached on a second inner side wall of the server case, the first shelves and the second shelves being alternately arranged to form a zigzagged air flow path in the receiving space; and a cable slot formed through the first inner side wall or the second inner side wall adjacent one of the shelves, wherein the cooling units are arranged on the first inner side wall and the second inner side wall along the air flow path, and wherein each of the cooling units includes a thermoelectric device with a heating side positioned outside the receiving space and a cooling side positioned inside the receiving space.

A plurality of shelf heat radiating fins are formed on a bottom of each of the shelves to thermally contact air in the receiving space.

Each of the shelf heat radiating fins includes at least eddy producing protrusion on a surface thereof to contact the air in the receiving space.

The inlet is formed at a lower side of the receiving space, and the outlet is formed at an upper side of the receiving space, and wherein an inter-shelf interval of the receiving space decreases from the lower side of the receiving space to the upper side of the receiving space.

According to the embodiments of the disclosure, the cooling rack achieves the cooling of servers with cooling units, i.e., thermoelectric devices, and may thus be simplified in structure over conventional mechanical server cooling systems, saving space and enabling an easy-to-install feature.

According to the embodiments of the disclosure, the shelves are alternately arranged to form a zigzagged air flow path in the receiving space. Thus, the air is cooled down by the cooling units and moved along the air flow path by the blower unit while thermally contacting the servers, thereby leading to a smooth cooling of the servers.

According to the embodiments of the disclosure, the shelf heat radiating fins have eddy producing protrusions to create eddies of air, which aids in smooth flow of cooled air. Further, the receiving space is configured so that the inter-shelf width reduces from the bottom to the top, which leads the air flow to getting speedier to the top and hence allows for further enhanced air flow and cooling.

Other objects of the disclosure are not limited to the foregoing objects, and other objects will be apparent to one of ordinary skill in the art from the following detailed description.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EXEMPLARY EMBODIMENTS

Hereinafter, exemplary embodiments of the disclosure will be described in detail with reference to the accompanying drawings. The same reference denotations may be used to refer to the same or substantially the same elements throughout the specification and the drawings. The disclosure, however, may be modified in various different ways, and should not be construed as limited to the embodiments set forth herein. As used herein, the singular forms "a," "an," and "the" are intended to include the plural forms as well, unless the context clearly indicates otherwise. As used herein, the terms "module" and "unit" are provided for ease of description and these terms can be interchangeably used.

When determined to make the subject matter of the disclosure unclear, the detailed description of the known art or functions may be skipped. The accompanying drawings are provided merely for a better understanding of the disclosure and the technical spirit or the scope of the invention are not limited by the drawings.

The terms coming with ordinal numbers such as 'first' and 'second' may be used to denote various components, but the components are not limited by the terms. The terms are used only to distinguish one component from another.

When a component is "connected to" or "coupled to" another component, the component may be directly connected or coupled to the other component, or other component(s) may intervene therebetween. In contrast, when a component is "directly connected to" or "directly coupled to" another component, no other intervening components may intervene therebetween.

It will be further understood that the terms "comprise" and/or "have," when used in this specification, specify the presence of stated features, integers, steps, operations, elements, and/or components, but do not preclude the presence or addition of one or more other features, integers, steps, operations, elements, components, and/or groups thereof.

Figure 1:
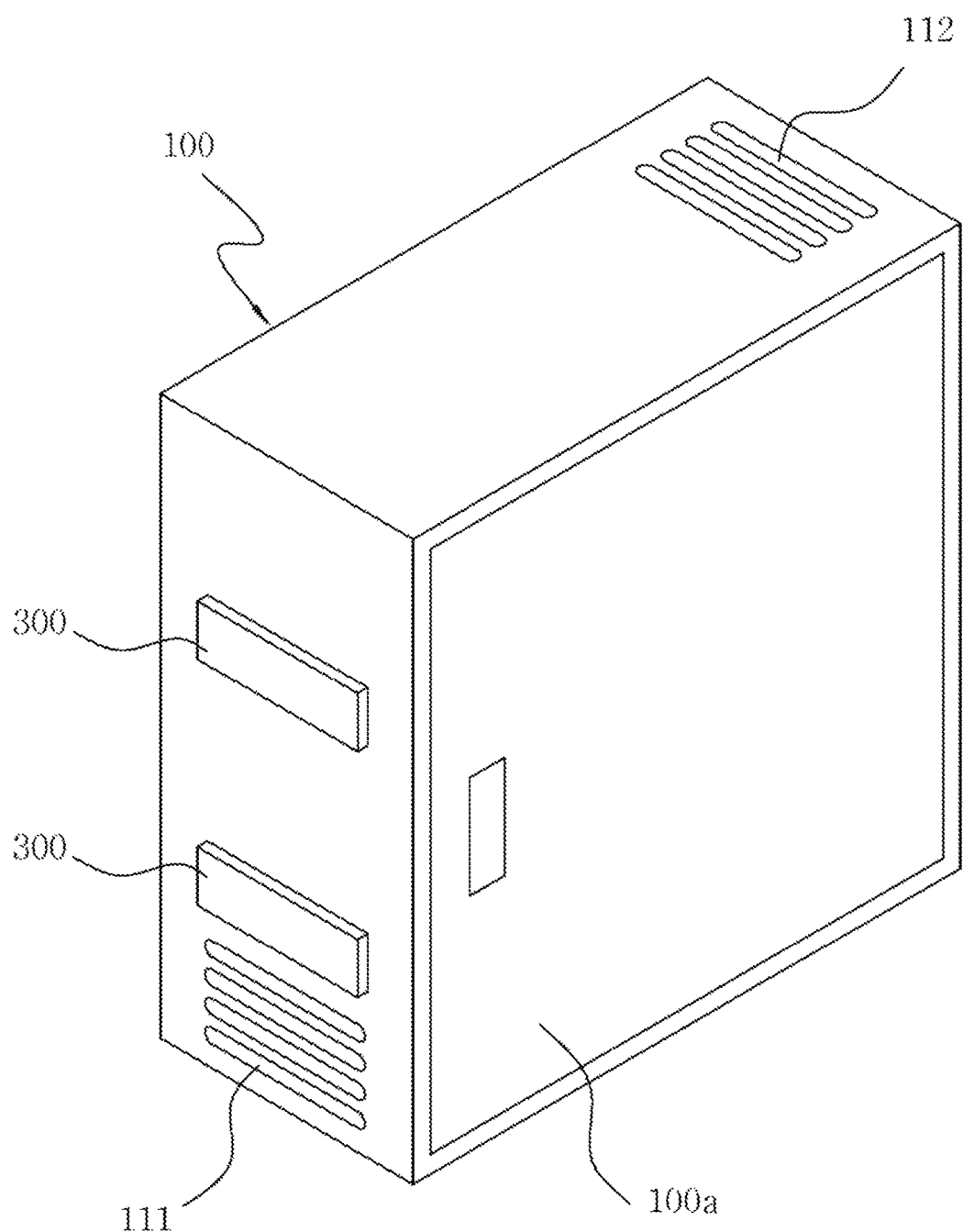
FIG. 1 is a perspective view illustrating a cooling rack for a server according to an embodiment of the disclosure.
Figure 2:
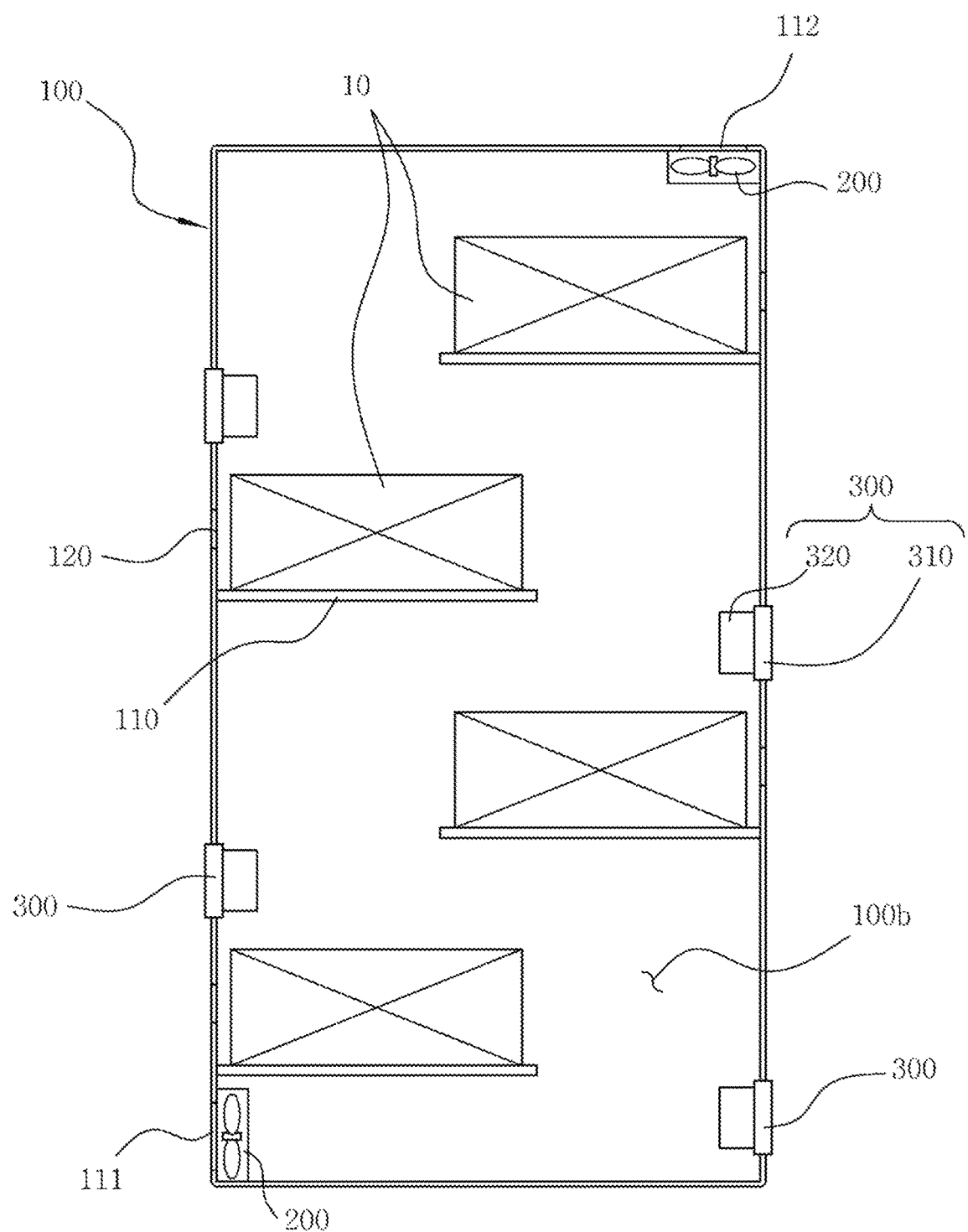
FIG. 2 is a cross-sectional view illustrating a cooling rack for a server according to an embodiment of the disclosure.
Figure 3:
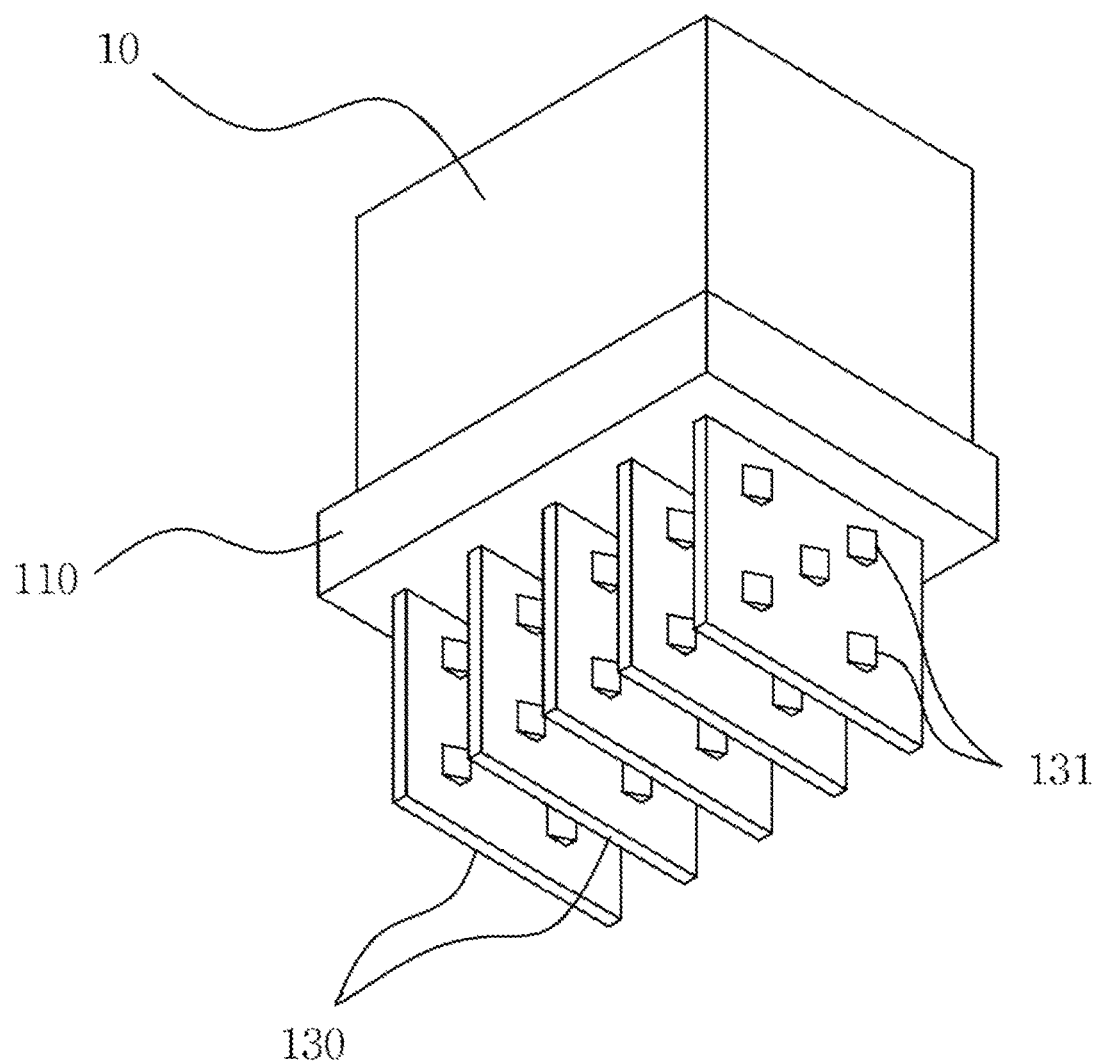
FIG. 3 is a bottom perspective view illustrating a configuration of a shelf of a cooling rack as shown in FIG. 2, according to an embodiment of the disclosure.

FIG. 1 is a perspective view illustrating a cooling rack for a server according to an embodiment of the disclosure. FIG. 2 is a cross-sectional view illustrating a cooling rack for a server according to an embodiment of the disclosure. FIG. 3 is a bottom perspective view illustrating a configuration of a shelf of a cooling rack as shown in FIG. 2, according to an embodiment of the disclosure. Referring to FIGS. 1 and 2, a cooling rack for a server may include a server case 100, blower units 200, and cooling units 300.

The server case 100 may receive a server 10 and may isolate the server 10 from the external environment.

The server 10 may be configured with a memory and a processor (e.g., a microprocessor) to allow the server 10 to mine cryptocoins, e.g., bitcoins. The server 10 may perform other various processes without being limited to cryptocurrency mining.

For example, the server case 100 may be configured as a container with an open/close door 100a, an internal receiving space 100b, and selves 110 for seating multiple servers 10 and cable slots 120.

The open/close door 100a may have a see-through or transparent window to allow the receiving space 100b to be shown from the outside.

The selves 110 are installed in the receiving space 100b of the server case 100 to allow servers 10 to rest thereon.

Referring to FIG. 2, the shelves 110 may be attached onto both inner walls of the server case 100 in the receiving space 100b, and servers 10 are placed on their respective shelves 110.

The shelves 110 may be alternately arranged from the bottom of the receiving space 110b to the top, thereby partitioning the receiving space 100b and forming an air flow path which is zigzag-shaped.

For example, a first set of shelves 110 may be attached onto a first inner side wall of the server case 100 and be spaced apart from each other at a predetermined interval. A second set of shelves 110 may be attached onto a second inner side wall of the server case 100, which is positioned opposite the first inner side wall, and be spaced apart from each other at a predetermined interval. The shelves 110 of the first set and the shelves 110 of the second set may alternately be arranged as shown in FIG. 2. The shelves 110 may project from the inner side walls of the server case 100, substantially perpendicular to the inner side walls.

The server case 100 may have an inlet 111, e.g., in the bottom side wall, through which air is introduced from the outside, and an outlet 112, e.g., in the top wall, through which air is discharged to the outside.

For example, the inlet 111 may be formed at the bottom of the receiving space 100b, and the outlet 112 may be formed at the top of the receiving space 100b.

The air flow introduced from the outside through the inlet 111 may cool down the servers 10 while traveling along the air flow path formed by the shelves 110 in the receiving space 100b and be then discharged through the outlet 112 to the outside.

The cable slots 120 may be formed through the inner side walls of the server case 100, adjacent to the servers 10, to allow various cables. e.g., a power cable and data cables for connection with the servers 10, to be in the receiving space 100b.

The cable slots 120 may be closed by cable sleeves (not shown), thereby preventing leakage of cooled air inside the receiving space 100b.

The cable sleeves (not shown) may be formed of a flexible or elastic material to tightly seal off the cable slots 120. Each cable sleeve (not shown) may have an insertion hole to let a cable(s) inserted into the receiving space 100b while blocking the cable slot 120.

The blower units 200 may blow external air through the inlet 111 into the receiving space 100b and discharge the internal air through the outlet 112 to the outside. Each blower unit 200 may include an air blower.

The blower units 200 may include a first blower unit 200 adjacent the inlet 111 and a second blower unit 200 adjacent the outlet 112. The blower units 200 may be operated under the control of a controller (not shown) to introduce air from the outside through the inlet 111 to the receiving space 100b and discharge air from the receiving space 100b through the outlet 112 to the outside.

The configuration of the blower units 200 is not limited thereto, and any known configuration for an air blower may be applicable to the blower units 200.

The cooling units 300 may be provided along the receiving space 100b of the server case 100 to cool down the air flow in the receiving space 100b, thereby cooling down the servers 10.

The cooling units 300 may be alternately provided along the receiving space 100b as shown in FIG. 2, and each cooling unit 300 may include a thermoelectric device and heat radiating fins 320.

The thermoelectric device 310 may take advantage of heating or cooling by the Peltier effect. The thermoelectric device 310 may generate heat at one side while cooling at the opposite side, and vice versa, depending on the direction of the current applied.

The cooling sides of the thermoelectric devices 310 may be placed in the receiving space 100b, alternately and with a set of the cooling sides on one inner side wall and another set of the cooling sides on the opposite inner side, while the heating sides thereof may be exposed to the outside of the server case. Air introduced into the receiving space 100b may be cooled down by the cooling sides of the thermoelectric devices 310 while flowing in the receiving space 100b and may then be discharged to the outside.

The heat radiating fins 320 may be integrally formed with the cooling side of each thermoelectric devices 310 and may thermally contact the air in the receiving space 100b to cool down the internal air.

The number of the thermoelectric devices 310 may correspond to, e.g., the same as, the number of the servers 10 as shown in FIG. 2. The thermoelectric devices 310 may be arranged to substantially face their corresponding servers 10.

The server case 100 may include a drainage member (not shown) to gather condensed water produced form the cooling sides of the thermoelectric devices 310 and to discharge the condensed water to the outside.

The thermoelectric devices 310 may be operated by the controller (not shown) and may be triggered for operation by a signal from a temperature sensor (not shown) embedded in the server case 100.

For example, the controller (not shown) may control the operating temperature and time of the thermoelectric devices 310 based on the internal temperature of the server case 100 detected by the temperature sensor.

Each shelf 110 may have multiple shelf heat radiating fins 130 on its bottom as shown in FIG. 3.

The shelf heat radiating fins 130 may be integrally formed on the bottom of the shelf 110 while projecting to the receiving space 100b. The shelf heat radiating fins 130 may thermally contact the air inside the receiving room 100b, cooling down the shelves 110 and hence riding the servers 10 of heat.

As shown in FIG. 3, each shelf heat radiating fin 130 may have an eddy producing protrusions 131 on the surface.

The eddy producing protrusions 131 project from the surface of each shelf heat radiating fin 130 to contact the air in the receiving space 100b, thereby creating eddies, or the swirling, of the traveling air in the receiving space 100b.

The air inside the receiving space 100b may move while creating eddies and may thus be smoothly discharged through the outlet 112.

Figure 4:
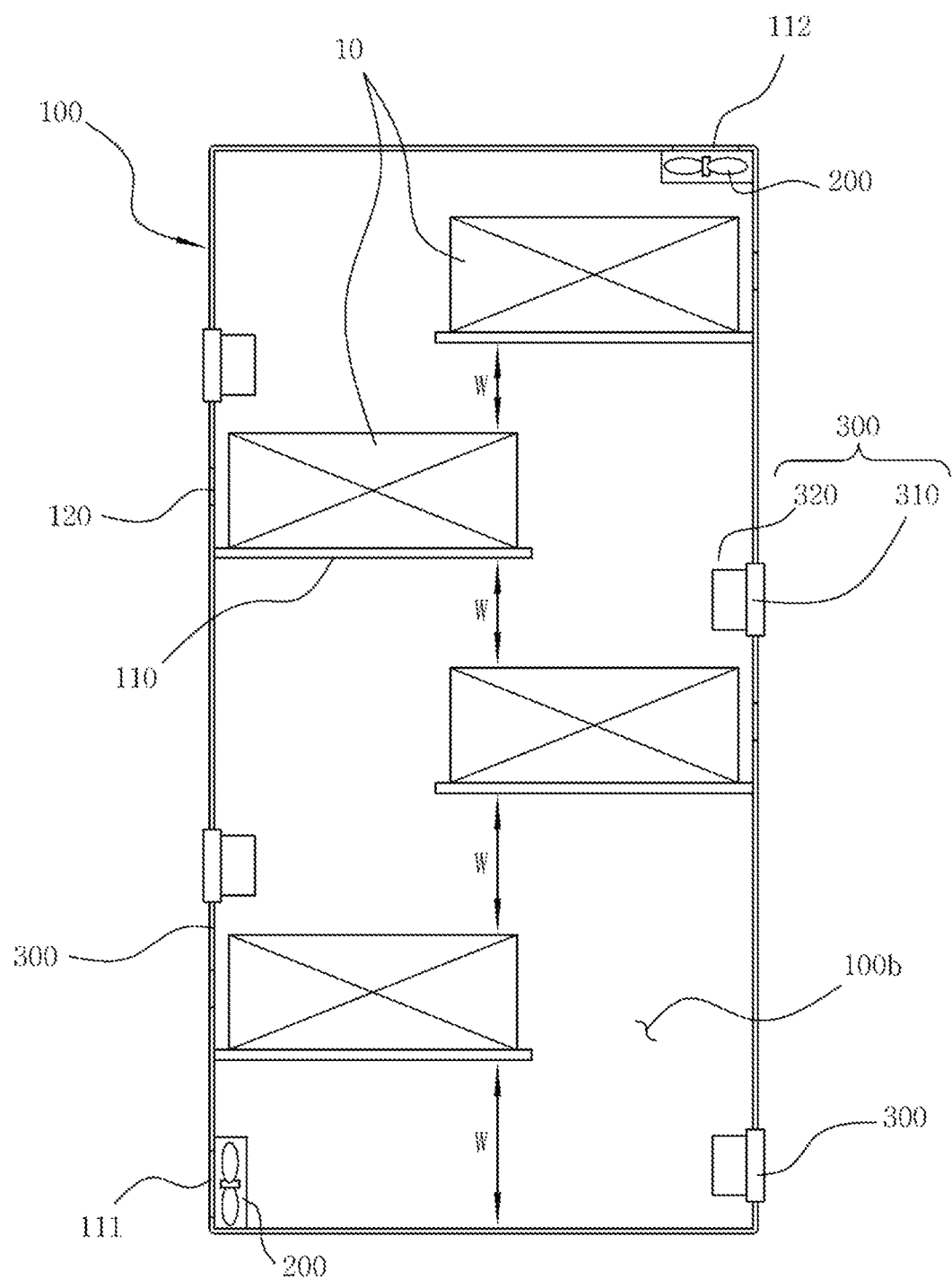
FIG. 4 is a cross-sectional view illustrating a cooling rack for a server according to an embodiment of the disclosure.

FIG. 4 is a cross-sectional view illustrating a cooling rack for a server according to an embodiment of the disclosure. Referring to FIG. 4, the receiving space 100b may narrow in inter-shelf interval from the bottom to the top.

For example, as the inter-shelf interval W reduces from the bottom to the top of the receiving space 100b, the area of cross section of the air flow path along which air flows may reduce from the bottom to the top.

As such, as the widths W decrease from the inlet 111 side to the outlet 112 side, the air flow may get speedier to the outlet 112, thereby allowing for smooth air drainage through the outlet 112.

A humidity sensor (not shown) and a dehumidifier (not shown) may be installed inside the server case 100 to put the humidity inside the receiving space 100b in control under the control of the controller (not shown).

Each cooling unit 300 may be equipped with a heating line (not shown) to heat air in the receiving space 100b through the heat generation from the heating side of the thermoelectric device 310.

The cooling unit 300 may dehumidify the receiving space 100b using the heating line.

For example, the cooling unit 300 may cool down the air through the cooling side of the thermoelectric device 310 while condensing moisture in the air and may then heat the air in the receiving space 100b through the heating line, thereby dehumidifying the air.

Although embodiments of the disclosure have been described with reference to the accompanying drawings. It will be appreciated by one of ordinary skill in the art that the present disclosure may be implemented in other various specific forms without changing the essence or technical spirit of the present disclosure. Thus, it should be noted that the above-described embodiments are provided as examples and should not be interpreted as limiting. Each of the components may be separated into two or more units or modules to perform its function(s) or operation(s), and two or more of the components may be integrated into a single unit or module to perform their functions or operations.

It should be noted that the scope of the disclosure is defined by the appended claims rather than the described description of the embodiments and include all modifications or changes made to the claims or equivalents of the claims.

What is claimed is:
1. A cooling rack, comprising:
   a server case with a receiving space, an inlet, and an outlet, a plurality of servers being received in the server case;
   a first blower unit provided adjacent to the inlet in the receiving space;
   a second blower unit provided adjacent to the outlet in the receiving space; and
   cooling units provided in the receiving space, wherein the server case includes first shelves attached on a first inner side wall of the server case and second shelves attached on a second inner side wall of the server case, the first shelves and the second shelves being alternately arranged to form a zigzagged air flow path in the receiving space; and a cable slot formed through the first inner side wall or the second inner side wall adjacent one of the shelves, wherein the cooling units are arranged on the first inner side wall and the second inner side wall along the air flow path, and wherein each of the cooling units includes a thermoelectric device with a heating side positioned outside the receiving space and a cooling side positioned inside the receiving space.

2. The cooling rack of claim 1, wherein a plurality of shelf heat radiating fins are formed on a bottom of each of the shelves to thermally contact air in the receiving space.

3. The cooling rack of claim 2, wherein each of the shelf heat radiating fins includes at least eddy producing protrusion on a surface thereof to contact the air in the receiving space.

4. The cooling rack of claim 1, wherein the inlet is formed at a lower side of the receiving space, and the outlet is formed at an upper side of the receiving space, and wherein an inter-shelf interval of the receiving space decreases from the lower side of the receiving space to the upper side of the receiving space.

* * * * *